(12) United States Patent
Hohendahl

(10) Patent No.: US 7,072,478 B2
(45) Date of Patent: Jul. 4, 2006

(54) MICROPHONE PREAMPLIFIER

(75) Inventor: Andres Hohendahl, Buenos Aires (AR)

(73) Assignee: Taylor Hohendahl Engineering LLP

( * ) Notice: Subject to any disclaimer, the term of this patent is extended or adjusted under 35 U.S.C. 154(b) by 773 days.

(21) Appl. No.: 10/254,030

(22) Filed: Sep. 24, 2002

(65) Prior Publication Data

US 2003/0076967 A1    Apr. 24, 2003

Related U.S. Application Data

(60) Provisional application No. 60/324,332, filed on Sep. 24, 2001.

(51) Int. Cl.
*H03F 21/00* (2006.01)

(52) U.S. Cl. ............... 381/120; 381/111; 381/95; 381/113; 381/114

(58) Field of Classification Search .......... 381/120, 381/111, 95, 113, 114; 330/110
See application file for complete search history.

(56) References Cited

U.S. PATENT DOCUMENTS

| | | | |
|---|---|---|---|
| 4,414,433 A * | 11/1983 | Horie et al. ............ 381/92 |
| 5,130,666 A | 7/1992 | Nicollini et al. ........ 330/253 |
| 5,337,011 A * | 8/1994 | French et al. ........... 330/258 |
| 5,357,214 A | 10/1994 | Heyl et al. ............. 330/297 |
| 5,377,273 A * | 12/1994 | Sutton ................... 381/122 |
| 5,589,799 A * | 12/1996 | Madaffari et al. ....... 330/277 |
| 6,057,737 A * | 5/2000 | Pritchard ............... 330/300 |
| 6,275,109 B1 | 8/2001 | Tang ..................... 330/261 |
| 6,577,187 B1 * | 6/2003 | Lesko ..................... 330/11 |

OTHER PUBLICATIONS

Ross "T.H.E. Mics," *RECORDING* Oct. 2001, vol. 15, No. 1.
T.H.E. "High Performance Microphones," T.H.E. Brochure.

* cited by examiner

*Primary Examiner*—Xu Mei
*Assistant Examiner*—Con P. Tran
(74) *Attorney, Agent, or Firm*—Bromberg & Sunstein LLP

(57) ABSTRACT

A microphone preamplifier. An electrical signal from a microphone is received via a shielded cable by an input stage cascaded with an output stage. The input stage contains an impedance converter and a phase inverter and receives feedback that reduces input capacitance, actively shields the coaxial cable, and stabilizes the input stage. The output stage contains a buffer and output driver and provides amplified versions of the input stage output. The preamplifier contains means for transformerless phantom powering the microphone and the microphone preamplifier, for sharing current between the input and the output stages, and for limiting the frequency at the output of the microphone.

24 Claims, 2 Drawing Sheets

MICROPHONE PREAMPLIFIER

CROSS REFERENCE TO RELATED APPLICATIONS

This application claims priority from U.S. Provisional Application No. 60/324,332, filed Sep. 24, 2001 which is incorporated herein by reference

TECHNICAL FIELD

The present invention relates to a microphone preamplifier, and, more particularly, to a capacitive microphone impedance converter in combination with a class A preamplifier with transformerless balanced low impedance output for phantom powering.

BACKGROUND ART

High performance microphones require immediate preamplification of the signal generated by the microphone capsule. Preamplifier performance in one area is often compromised to achieve performance in another area. For example, needs for immunity to input noise, large output signals capable of driving large capacitive loads, insensitivity to variations in supply voltages, low power requirements, and economic design can conflict. As a result, preamplifier designs often satisfy one requirement at the expense of not satisfying other requirements.

SUMMARY OF THE INVENTION

In accordance with one aspect of the present invention, a preamplifier is described where immunity from radio frequency pickup at the output, low power, low input equivalent voltage and current noise, low output impedance, high input impedance, low input capacitance, high gain, low power consumption, stable driving of large capacitive loads, stabilized DC working point, and differential output can be simultaneously and self-consistently achieved. A sharing of resources reduces costs.

In one embodiment of the invention, an input signal from a microphone or capsule is fed via a coaxial cable through a cascade of a first stage and a second stage. The first stage generates as input-stage output an in-phase output signal and an inverted-phase output signal that the output stage uses to generate an amplified in-phase output signal and an amplified inverted-phase output signal. The first stage can contain an impedance converter as well as a phase inverter, and the second stage a buffer as well as an output driver.

The preamplifier contains means for phantom powering of both itself and the microphone, for sharing current between the input and the output stages, and for limiting the upper frequency at the preamplifier output and shielding the preamplifier output from radio frequency interference. In addition, the preamplifier contains feedback means to lower the input capacitance of the input stage, to stabilize the input stage, and to actively shield the coaxial cable. The effects of stray input capacitance are reduced through printed circuit board and ground plane design.

In another embodiment, a microphone preamplifier contains a phase inverter that receives an electrical signal via a shielded coaxial cable from a means of generating an electrical signal from sound pressure. The phase inverter contains a combination of a cascode and a first transistor that produces as inverter output an in-phase output signal and an inverted-phase output signal and that feeds back inverter output to the input of the cascode and to the shield of the coaxial cable.

The preamplifier also contains a driver containing a second and a third transistor where the second transistor receives the in-phase output signal and produces an amplified in-phase output signal and the third transistor receives the inverted-phase output signal and produces an amplified inverted-phase output signal. An input-stage power supply conditioner receives residual current from the driver stage and supplies voltage and current to the phase inverter. First and second frequency limiters receive the amplified in-phase and amplified inverted-phase signals and generate preamplifier in-phase and inverted-phase output signals. A polarization power supply connected to the first and second frequency limiters supplies voltage to the means for producing an electrical signal from sound pressure.

BRIEF DESCRIPTION OF THE DRAWINGS

The foregoing features of the present invention will be more readily understood by reference to the following detailed description taken with the accompanying drawings, in which.

DETAILED DESCRIPTION OF A SPECIFIC EMBODIMENT

Figure 1:
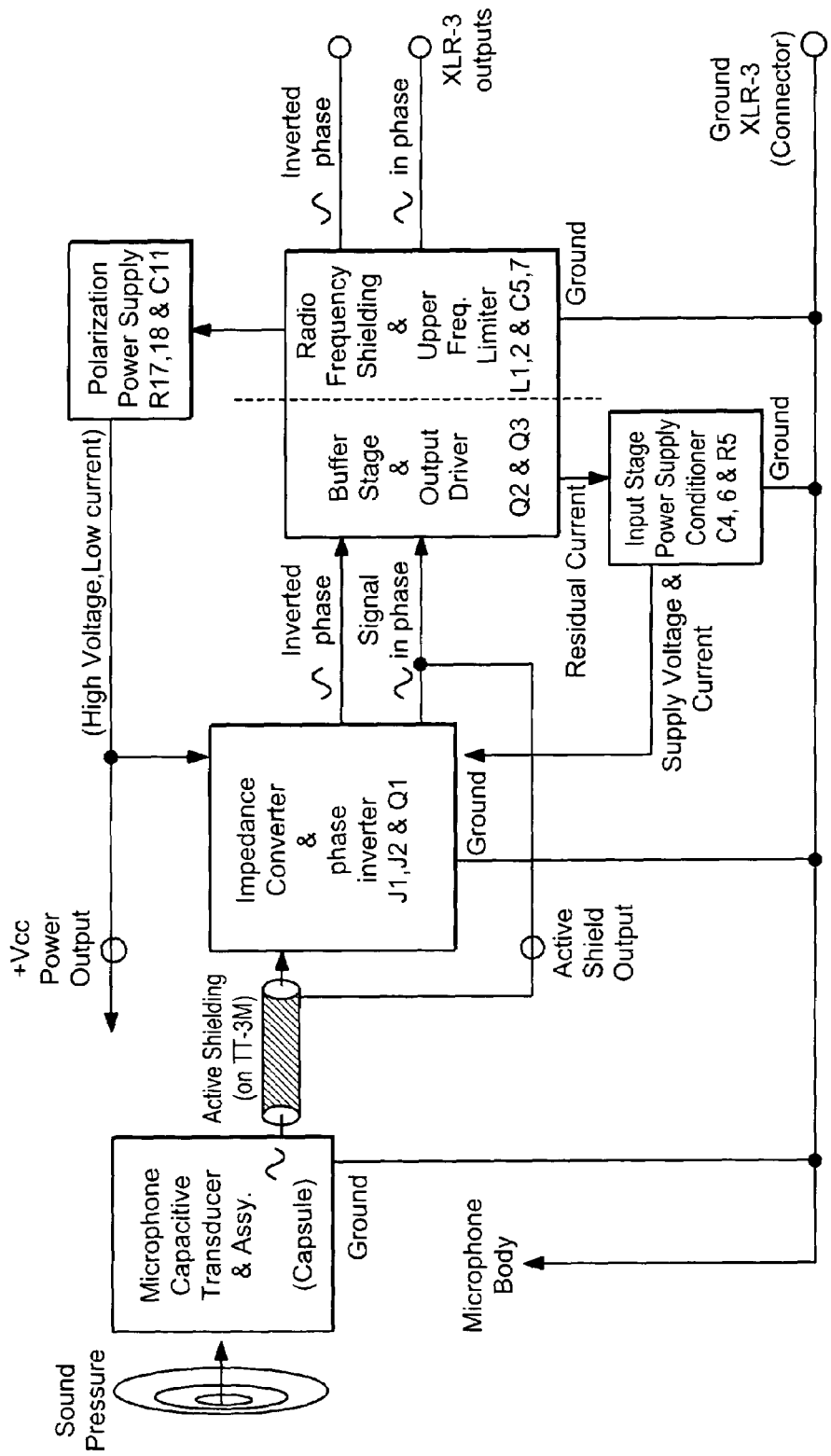
FIG. 1 shows a functional diagram of a microphone preamplifier configured in accordance with a preferred embodiment of the invention.

A functional diagram of an embodiment of the invention is shown in FIG. 1. A capsule, i.e., a microphone capacitive transducer, converts sound pressure into an electrical signal that is communicated to an impedance converter/phase inverter via an actively shielded cable. The in-phase and inverted-phase versions of the signal generated by the impedance converter/phase inverter are each transmitted to a cascade of a buffer stage/output driver and a radio frequency shielder/upper frequency limiter that provides in-phase and inverted-phase output signals.

Several additional functions address efficiency of design and stability of operation. The radio frequency shielder/upper frequency limiter communicates with a polarization power supply that generates a voltage for the capsule. The buffer stage/output driver communicates with an input stage power supply conditioner that generates supply voltage and current for the impedance converter/phase inverter. The in-phase output of the impedance converter/phase inverter is fedback, both to actively shield the cable carrying the signal between the capsule and the impedance converter/phase inverter and to stabilize the impedance converter/phase converter and the DC working point.

Figure 2:
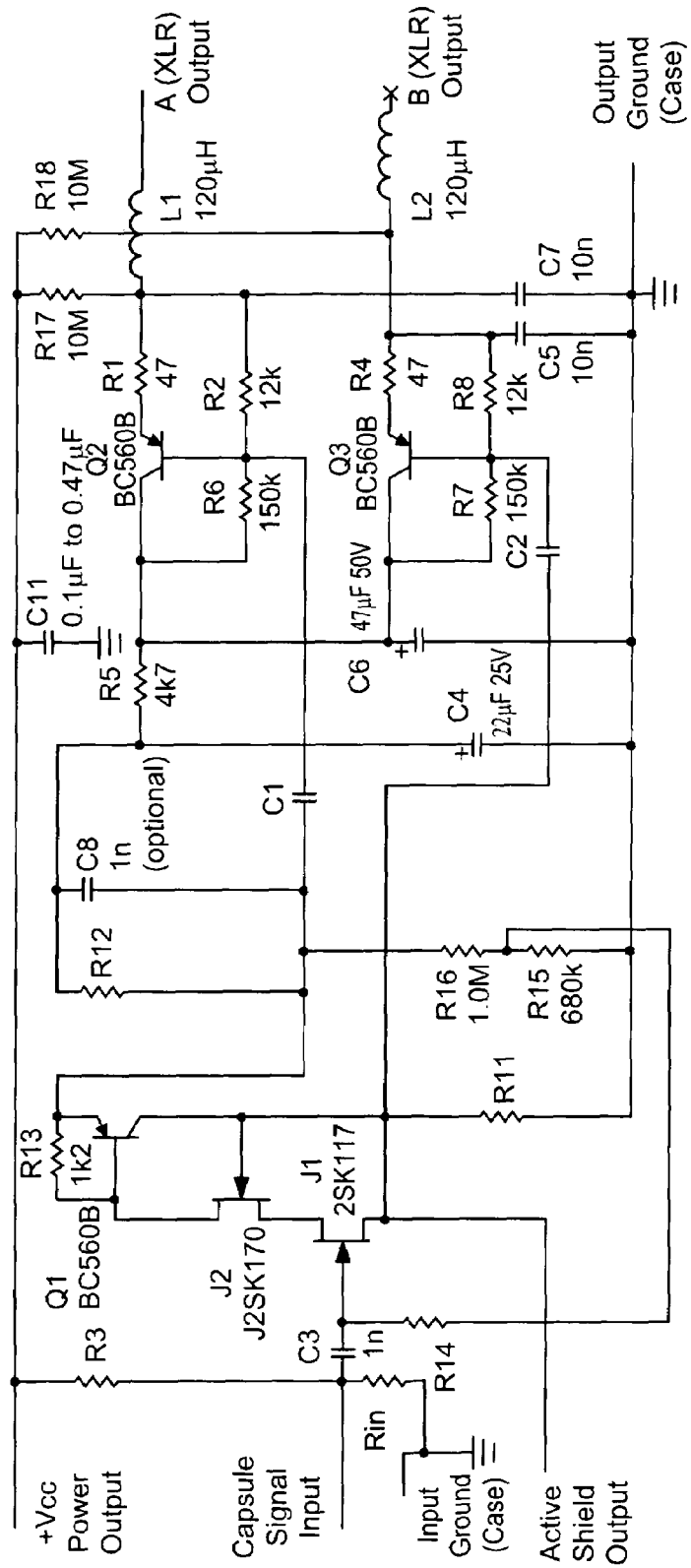
FIG. 2 schematically shows a microphone preamplifier configured in accordance with a preferred embodiment of the invention.

In an illustrative embodiment of the invention, FIG. 2 schematically shows a microphone preamplifier in which a signal from a microphone capsule is fed into an impedance converter/phase inverter corresponding to the cascode arrangement of JFETs J1 and J2 in conjunction with transistor Q1 as a power stage. The cascode gives excellent input noise performance for both $V_{in}$ and $I_{in}$ and a very high input impedance. The buffered signals then pass through dual output buffer followers corresponding to transistors Q2 and Q3 and their respective associated components. The impedance converter/phase inverter and the buffer stage/output drivers share a current source, corresponding to the current passing through R5.

Additional preamplifier features contribute to optimized performance. Active feedback with Q1 as a power source reduces preamplifier input capacitance towards zero. Design of the printed circuit board actively and physically insulates components and electrical paths, consequently reducing stray capacitance and improving stability. Active feedback, corresponding to a virtual and active ground, is provided at the input and actively shields the input coaxial cable. Consequences are lowered input shunt capacitance, total system distortion, and noise and increased stability. Negative feedback provided by R14 stabilizes the input buffer stage and the DC working point. Because of the high frequency range of the circuit of FIG. 2, elements L1, L2, C5, and C7 stabilize by providing insulation from radio frequency pickup on output cables without causing loss of output signal.

Good preamplifier performance depends upon proper selection of component values and the tolerances of those values. $I_D$ for JFETs J1 and J2 should match within 5% between 0.8 and 1.0 ma. For transistors Q2 and Q3, $h_{fe}$ should exceed 300 and their $V_{be}$ at $I_{cq}=1$ ma must match. Transistor Q1 $h_{fe}$ should exceed 200 and have acceptable noise specifications for $I_c$ between 0.5 and 1.0 ma.

The above features allow this embodiment of the invention to reach a peak output (i.e., differential between outputs A and B) of 18 volts. They also permit the final gain, input noise, and output sweep capability of the embodiment to be immune to a several volt variation of the input DC voltage (±8 volts for the Phantom Powering of 48 volts).

The KA-04 microphone preamplifier and the TT-3M microphone incorporate embodiments of the invention as described in FIG. 2. Component values vary somewhat between the KA-04 and the TT-3M. Input resistor $R_{in}$ is added or changed because of the needs of input polarization for the KA-04 and the use of a "pre-polarized" capsule on the TT3M.

The advantages of these embodiments are further discussed in the article: "Review: T.H.E. Mics: A New Manufacturer Rolls Out a Remarkable Line of Quality Microphones" (B. Ross, Recording, volume 15, number 1, October 2001). A copy of this article is included as Appendix A to this application. Specification sheets for several T.H.E. products incorporating this invention are included as Appendix B. Both Appendix A and Appendix B are incorporated herein by reference.

Although various exemplary embodiments of the invention have been disclosed, it should be apparent to those skilled in the art that various changes and modifications can be made which will achieve some of the advantages of the invention without departing from the true scope of the invention.

What is claimed is:

1. A microphone preamplifier, comprising:
   a cascade of an input stage and an output stage wherein the input stage has an input capacitance, receives an input signal from a microphone through a coaxial cable, and generates as input-stage output an in-phase output signal and an inverted-phase output signal and the output stage generates an amplified in-phase output signal and an amplified inverted-phase output signal;
   means for transformerless phantom powering of the microphone and the microphone preamplifier;
   means for sharing current between the input and output stages;
   means for actively feeding back input-stage output wherein the input capacitance is lowered;
   means for actively feeding back input-stage output wherein the coaxial cable is actively shielded; and
   means for negatively feeding back input-stage output wherein the input stage is stabilized.

2. The preamplifier of claim 1, wherein the input stage comprises an impedance converter and a phase inverter.

3. The preamplifier of claim 2, wherein the input stage comprises a cascode and a first transistor.

4. The preamplifier of claim 3, wherein the cascode comprises a first JFET transistor and a second JFET transistor.

5. The preamplifier of claim 4, wherein the $I_{DSS}$ of the first JFET and the $I_{DSS}$ of the second JFET are between 1 ma and 0.8 ma.

6. The preamplifier of claim 4, wherein the $I_{DSS}$ of the first JFET and the $I_{DSS}$ of the second JFET match within 5%.

7. The preamplifier of claim 3, wherein the first transistor $h_{fe}$ exceeds 200.

8. The preamplifier of claim 1, wherein the output stage comprises a buffer and an output driver.

9. The preamplifier of claim 8, wherein the output stage comprises a second transistor that receives the in-phase output signal from the input stage and generates the amplified in-phase output signal and a third transistor that receives the inverted-phase output signal from the input stage and generates the amplified inverted-phase output signal.

10. The preamplifier of claim 9, wherein the second transistor $h_{fe}$ and the third transistor $h_{fe}$ exceed 300.

11. The preamplifier of claim 9, wherein the second transistor $V_{be}$ and the third transistor $V_{be}$ match at $I_{cq}=1$ ma.

12. The preamplifier of claim 9, further comprising a first radio frequency shield/upper frequency limiter and a second radio frequency shield/upper frequency limiter wherein the first radio frequency shield/upper frequency limiter receives the amplified in-phase signal and generates a preamplifier in-phase output signal and the second radio frequency shield/upper frequency limiter receives the amplified inverted-signal and generates a preamplifier inverted-phase output signal.

13. The preamplifier of claim 12, wherein the first radio frequency shield/upper frequency limiter and the second radio frequency shield/upper frequency limiter are connected to a phantom power source.

14. The preamplifier of claim 13, further comprising a polarization power supply that connects the first radio frequency shield/upper frequency limiter and the second radio frequency shield/upper frequency limiter to the microphone.

15. The preamplifier of claim 14, wherein the polarization power supply comprises a first resistor connected to the first radio frequency shield/upper frequency limiter, a second resistor connected to the second radio frequency shield/upper frequency limiter, and a capacitor connected to the first resistor and to the second resistor.

16. The preamplifier of claim 1, further comprising a printed circuit board wherein the preamplifier is mounted on the printed circuit board so as to actively insulate a first component and a connection to the first component of the preamplifier from a second component and a connection to the second component of the preamplifier.

17. A microphone preamplifier, comprising:
   phase inverter comprising a cascode and a first transistor, wherein the phase inverter receives an electrical signal from a means of producing the electrical signal from sound pressure, produces inverter output comprising an in-phase output signal and an inverted-phase output signal of the electrical signal, and receives a first feedback and a second feedback of the inverter output;

coaxial cable comprising a wire communicating the electrical signal to the phase inverter and a shield receiving a third feedback of the inverter output;

a driver stage comprising a second and a third transistor wherein the second transistor receives the in-phase output signal and produces an amplified in-phase output signal and the third transistor receives the inverted-phase output signal and produces an amplified inverted-phase output signal;

an input-stage power-supply conditioner receiving a residual current from the driver stage and supplying a voltage and current to the phase inverter;

first upper frequency limiter, wherein the first upper frequency limiter receives the amplified in-phase output signal and generates a preamplifier in-phase output signal;

a second upper frequency limiter, wherein the second upper frequency limiter receives the amplified inverted-phase output signal and generates a preamplifier inverted-phase output signal; and a polarization power supply communicating with the first and second upper frequency limiters and supplying voltage to the means for producing an electrical signal.

18. The preamplifier of claim 17, wherein the cascode comprises a first and a second JFET transistor.

19. The preamplifier of claim 18, wherein the first JFET $I_{DSS}$ and the second JFET $I_{DSS}$ are between 1 ma and 0.8 ma.

20. The preamplifier of claim 18, wherein the first JFET $I_{DSS}$ and the second JFET $I_{DSS}$ match within 5%.

21. The preamplifier of claim 17, wherein the second transistor $h_{fe}$ and the third transistor $h_{fe}$ exceed 300.

22. The preamplifier of claim 17, wherein the second transistor $V_{be}$ and the third transistor $V_{be}$ match at $I_{cq}=1$ ma.

23. The preamplifier of claim 17, wherein the first transistor $h_{fe}$ exceeds 200.

24. The preamplifier of claim 17, wherein the preamplifier is mounted on a printed circuit board that actively and physically insulates a first component of the preamplifier from a second component of the preamplifier.

* * * * *